(12) United States Patent
Banzhof et al.

(10) Patent No.: US 8,735,847 B2
(45) Date of Patent: May 27, 2014

(54) HIGH RESOLUTION GAS FIELD ION COLUMN WITH REDUCED SAMPLE LOAD

(75) Inventors: Helmut Banzhof, Poing (DE); Juergen Frosien, Riemerling (DE); Dieter Winkler, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 596 days.

(21) Appl. No.: 12/277,818

(22) Filed: Nov. 25, 2008

(65) Prior Publication Data

US 2009/0146074 A1 Jun. 11, 2009

(30) Foreign Application Priority Data

Dec. 5, 2007 (EP) .................................. 07023587

(51) Int. Cl.
*G21K 1/08* (2006.01)
(52) U.S. Cl.
USPC ....... 250/396 R; 250/306; 250/307; 250/310; 250/397; 250/396 ML
(58) Field of Classification Search
USPC .......................... 250/306, 307, 309, 310, 311
See application file for complete search history.

(56) References Cited

U.S. PATENT DOCUMENTS

| | | | |
|---|---|---|---|
| 2006/0097193 A1* | 5/2006 | Horsky et al. | 250/492.21 |
| 2007/0009379 A1* | 1/2007 | Bau et al. | 422/57 |
| 2007/0187621 A1* | 8/2007 | Ward et al. | 250/492.21 |
| 2007/0215802 A1 | 9/2007 | Ward | |
| 2007/0228287 A1 | 10/2007 | Ward | |

FOREIGN PATENT DOCUMENTS

| | | |
|---|---|---|
| JP | 04-272640 A | 9/1992 |
| JP | 06-168688 A | 6/1994 |
| JP | 2001-351561 A | 12/2001 |
| JP | 2006-004671 A | 1/2006 |
| JP | 2006-120331 A | 5/2006 |
| JP | 2007-059297 | 3/2007 |
| WO | WO2006/133241 A2 | 12/2006 |
| WO | WO2006/133291 A2 | 12/2006 |

OTHER PUBLICATIONS

Extended European Search Report, EP 07023587; Apr. 15, 2008.
J. Orloff, et al; "A Scanning Ion Microscope with a Field Ionization Source"; Scanning Electron Microscopy; Mar. 1977; vol. I; ITT Research Institute; Chicago, Illinois; XP009080827.
R. Levi-Setti, et al; "High Resolution Scanning Ion Probes: Applicatoins to Physics and Biology"; Nuclear Instruments and Methods 168 (1980) 139-149; North-Holland Publishing Co.; XP09073481.
John Morgan; et al: "An Introduction to the Helium Ion Microscope"; Microscopy Today; vol. 14, No. 4; Jul. 2006; Peabody, MA; XP007903654.
Notice of Reasons for Refusal dated Sep. 8, 2011 for Japanese Patent Application No. 2008-304244.

* cited by examiner

*Primary Examiner* — Nicole Ippolito
*Assistant Examiner* — Hanway Chang
(74) *Attorney, Agent, or Firm* — Patterson & Sheridan, LLP (57) ABSTRACT

A method of operating a focused ion beam device having a gas field ion source is described. According to some embodiments, the method includes emitting an ion beam from a gas field ion source, providing an ion beam column ion beam energy in the ion beam column which is higher than the final beam energy, decelerating the ion beam for providing a final beam energy on impingement of the ion beam on the specimen of 1 keV to 4 keV, and imaging the specimen.

9 Claims, 4 Drawing Sheets

HIGH RESOLUTION GAS FIELD ION COLUMN WITH REDUCED SAMPLE LOAD

FIELD OF THE INVENTION

Embodiments described herein relate to ion beam devices and methods of operating ion beam devices. In particular, embodiments relate to high resolution ion beam devices including a gas field ion source emitter and methods of operating high resolution ion beam devices including gas field ion source emitters. Specifically, they relate a method of operating a focused ion beam device.

BACKGROUND OF THE INVENTION

Charged particle beam apparatuses have many functions in a plurality of industrial fields, including, but not limited to, inspection of semiconductor devices during manufacturing, testing systems, imaging systems, detecting devices, and exposure systems for lithography. Thus, there is a high demand for use of charged particle beam devices for structuring and inspecting specimen within the micrometer and nanometer scale as well as a sub-nanometer scale.

Focused charged particle optical systems using a gas field ion source emitter promise a considerable decrease in probe diameter over state of the art systems, e.g., electron microscopes or liquid metal ion source devices (LMIS). In comparison to electron microscopes, charged particle optical systems using a gas field ion source emitter promise a considerable decrease in probe diameter, e.g., due to their smaller virtual source size and the short wavelengths of ions. In comparison to LMIS devices charged particle optical systems using a gas field ion source emitter promise a considerable decrease in probe diameter, e.g., due to their smaller virtual source size and the smaller energy width of the ion beam. In particular for imaging, inspection, and testing systems, wherein an image of a specimen is obtained, there is an increasing demand for higher resolutions. Accordingly, effort has been taken to bring focused ion beam optical system using gas field ion sources to practice.

In order to enable very high resolutions, a variety of system requirements for focused ion beam optical system using a gas field ion source have to be considered. Thereby, previous technology from electron microscopes and liquid metal ion source devices can, on the one hand, be applied. On the other hand, for improving focused ion beam optical systems having gas field ion sources for image generation, the differences of focused ion beams as compared to electron beams or beams of LMIS devices have to be carefully considered.

SUMMARY

In light of the above, a method of operating an ion beam device is provided.

According to one embodiment, a method of operating a focused ion beam device having a gas field ion source is provided. The method includes emitting an ion beam from a gas field ion source, providing an ion beam column ion beam energy in the ion beam column which is higher than the final beam energy, decelerating the ion beam for providing a final beam energy on impingement of the ion beam on the specimen of 1 keV to 4 keV, and imaging the specimen.

Embodiments are also directed to apparatuses for carrying out the disclosed methods and including apparatus parts for performing described method steps. Furthermore, embodiments are also directed to methods by which the described apparatus operates or by which the described apparatus is manufactured. It may include method steps for carrying out functions of the apparatus or manufacturing parts of the apparatus. The method steps may be performed by way of hardware components, firmware, software, a computer programmed by appropriate software, by any combination thereof or in any other manner.

It is contemplated that elements of one embodiment may be advantageously utilized in other embodiments without further recitation.

BRIEF DESCRIPTION OF THE DRAWINGS

Some of the above indicated and other more detailed embodiments of the invention will be are described in the following description and partially illustrated with reference to the figures. Therein.

DETAILED DESCRIPTION OF THE DRAWINGS

Within the following description of the drawings, the same reference numbers refer to the same components. Generally, only the differences with respect to the individual embodiments are described.

Generally, focused ion beam devices can, for example, be based on liquid-metal ion sources or gas ion sources. Gas ions can be produced by bombardment of electrons, atoms or ions with gas atoms or molecules or by exposing gas atoms or molecules to high electric fields or irradiation. Thereby, noble gas ion sources have been found to be potential candidates for focused ion beam (FIB) applications. Sources based on the field ionization process are known as gas field ion sources (GFIS). An ionization process takes place at high electric fields larger $10^{10}$ V/m. The field may, for example, be applied between an emitter tip and a biased extraction aperture.

The emitter tip is biased to a, e.g., 10 kV positive potential with respect to a downstream extraction aperture that produces an electric field strong enough to ionize the gas atoms in the vicinity of the emitter unit. The area in the vicinity of the emitter, wherein the desired electric field is provided or more generally, wherein the generation of ions is conducted, may be referred to as emitter area. Gas pressures of $10^{-6}$ mbar, $10^{-2}$ mbar are desirable near the emitter tip.

For gas field ion source imaging devices it has been found that some of the developments for electron microscopes, ion implanting apparatuses and patterning systems, i.e. specimen modification apparatuses can be applied. However, there are a plurality of differences with regard to aberrations, lateral scattering of ions in the specimen, and the possible use made for optical elements. Thus, a plurality of developments made for electron microscopes, ion implanting apparatuses and patterning systems cannot be applied for focused ion beam systems used for imaging, inspection or testing of a specimen.

An improved resolution for gas field ion beam columns can be realized if the device is operated at high particle energies such as for example 50 kV. In this case the velocity at which the ions traverse the column is high. This reduces ion-ion-interaction and the loss of resolution due to the inherent energy width of the emitted ion beam and the chromatic aberrations coefficient of the lenses used in the system can be minimized. Typically, for an imaging mode of gas field ion source devices, light ions such as for example, helium or hydrogen can be used. Light ions reduce the likelihood of specimen damage during imaging.

However, even for light ions, a reduction or avoiding of loads on the sample have to be considered for imaging systems, because defects such as amorphisation or crystal defects may be generated. Furthermore, resists may change their dimensions (shrinkage) due to the influence of the ion beam.

Accordingly, the need for a high resolution, which would imply high particle energies is in conflict with the desire of reduced sample loads, which might for example be lowered by emitting ions such that the particle energy on impingement on the specimen are reduced. Thereby, ions arrive at the specimen with lower energy such that interactions and damage could be reduced.

It is however known from low-voltage electron microscopes that the resolution of, for example, a scanning electron microscope, is often limited by the lateral scattering of the primary electrons in the sample material. Thus, the reduced final beam energy on the specimen would nullify a potential improvement that could be achieved by using ion beams instead of electron beams. Accordingly, a lateral scattering amplitude of above 1 nm for low voltage electron microscopes would result in analogy to a situation wherein an improvement in resolution for an ion beam would be nullified of the ion beam energy would be reduced. However, it has been found that for gas field ion microscopes, in contrast to electron microscopes, a very low lateral scattering amplitude occurs even for low energies. Thus, it is according to embodiments described herein possible to lower the energy of the ion beam without negatively affecting the resolution of the imaging system by a lateral scattering of the primary ions in the sample material to an extent known from electron microscopes.

Therefore, according to embodiments described herein, methods of operating gas field ion beam columns are provided, wherein the final beam energy, that is, for an imaging mode, the energy of the primary ion beam on impingement on a specimen, is reduced to be in a range of about 1 kV to about 5 kV.

Figure 1:
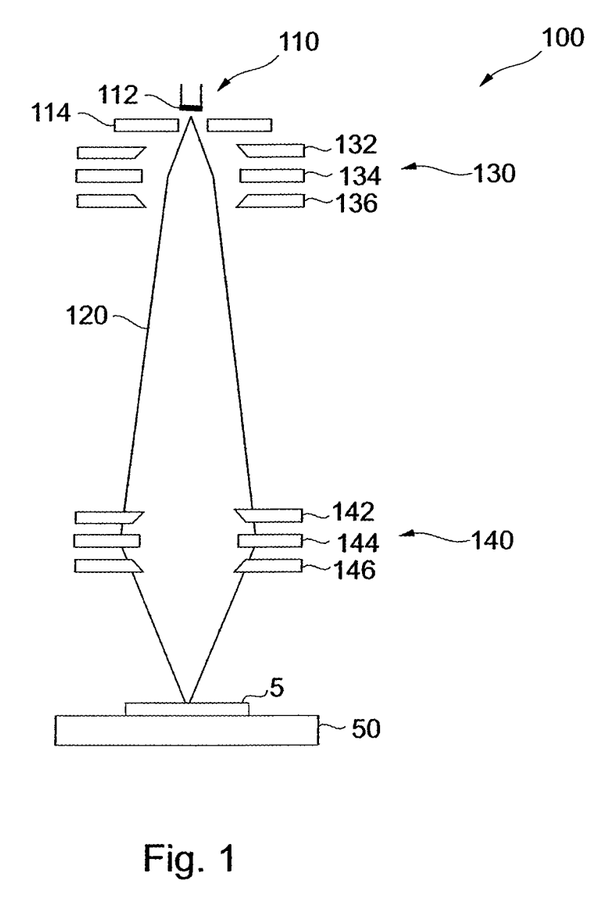
FIG. 1 shows a schematic diagram of an ion beam device including electrostatic lenses.

FIG. 1 shows an ion beam device 100, in particular a focus ion beam device. According to embodiments described herein, an ion beam device includes an ion source 110, typically a gas field ion source. The gas field ion source includes an emitter tip 112 emitting ions along an optical axis in the ion beam column. Further, an extractor 114 is provided. According to some embodiments, which can be combined with other documents described herein, the extractor can be omitted.

The embodiment illustrated in FIG. 1 shows two electrostatic lenses 130 and 140. However, according to other embodiments an ion beam device with one electrostatic lens, 3, 4 or even more electrostatic lenses can be provided. In contrast to electron microscopes, wherein often magnetic or combined magnetic-electrostatic lenses are used for high resolution systems, ion beam devices typically do not include magnetic lens components. Accordingly, lens design aspects cannot be transferred one-to-one from the electron microscopes.

According to embodiments illustrated with regard to FIG. 1, which can be combined with other embodiments described herein, each of the electrostatic lenses 130 and 140 includes three electrodes 132, 134, 136 and 142, 144, 146, respectively. The ion beam 120 is shaped and/or focused by the electrostatic lenses and focused on a specimen 5, which is placed on a specimen support 50.

Figure 2:
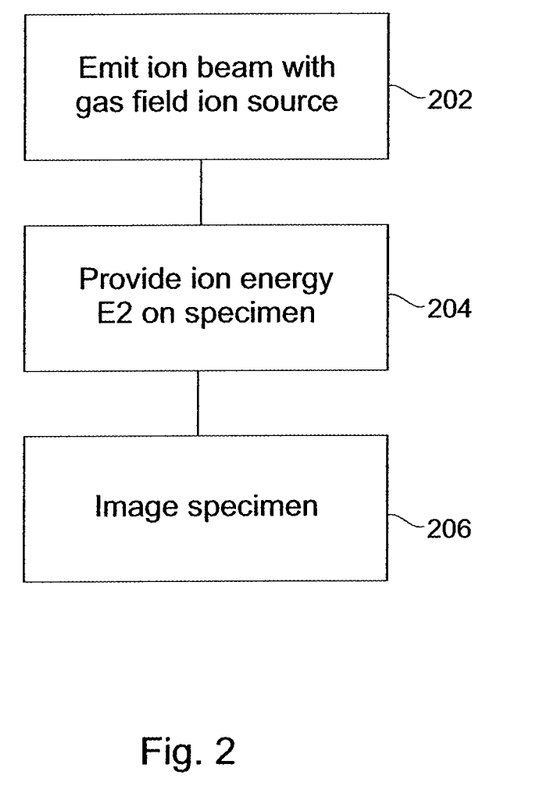
FIG. 2 illustrates embodiments of operating an ion beam device, wherein a reduced ion beam energy is provided on the specimen.

FIG. 2 illustrates further embodiments described herein. In step 202 an ion beam is emitted with a gas field ion source. The ion beam is guided through the ion beam column and impinges on the specimen. Thereby, according to step 204, an ion beam energy $E_2$ of about 1 keV to 4 keV, for example 3 keV, is provided for impingement of the ion beam on the specimen. Typically the ion beam is focused on the specimen, such that an image of the specimen can be generated in step 206. For example, the image is generated by scanning the focused ion beam over the specimen and detecting backscattered and/or secondary particles with a detector. According to different embodiments, which can be combined with other embodiments described herein, backscattered and/or secondary ions, secondary electrons, X-rays or photons can be detected with corresponding detectors. According to even further embodiments, scintillation detectors, photomultipliers, photo diodes or a combination thereof can be used for detecting the particles.

According to some embodiments described herein, the ion beam energy on the specimen is provided to be in a range that is lower than the ion beam in energy of common focused ion beam devices. Thereby, a compromise between maximum resolution and reduced sample load can be realized. However, contrary to low-voltage electron microscopes, a lateral scattering amplitude at these reduced energies is less than the lateral scattering of a primary electron beam in the specimen. Since the lateral scattering amplitude in the specimen has to be found to be of less relevance for ion microscopes as compared to electron microscopes, a very high resolution device can be realized. According to embodiments described herein, which can be combined with other embodiments described herein, a gas field ion source ion beam device adapted for very high resolutions can be considered to provide a resolution of below 1 nm, typically below 0.8 nm, below 0.6 nm or even lower. Thereby, the resolution, e.g., of a scanning microscope correlates with the beam probe diameter and is often defined as the distance between two imaging pixels that can be resolved.

In light of the reduced effect of lateral scattering on resolution, the resolution for an imaging ion beam device is not affected as much for an ion beam microscopes as compared to a low-voltage electron microscopes. Thus, ion beam energies can be reduced to lower energies as compared to common ion beam devices.

Figure 3:
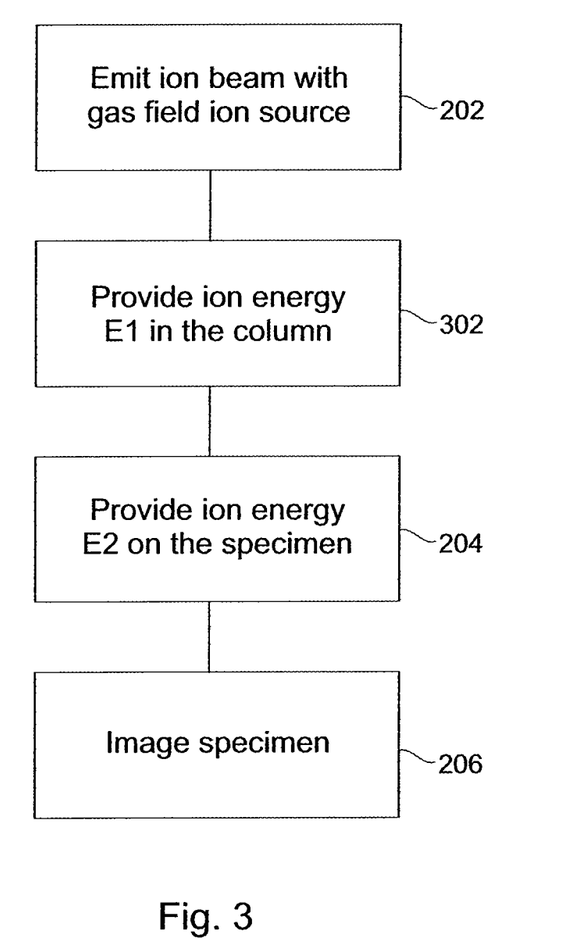
FIG. 3 illustrates embodiments of operating an ion beam device, wherein a reduced ion beam energy is provided on the specimen and the ion beam energy in the column is above the ion beam energy on the specimen.

According to further embodiments, which are illustrated with respect to FIG. 3, the ion beam is emitted from a gas field ion source in step 202. The ion energy $E_2$ on the specimen is provided to be in a range of for example 1 keV to 4 keV, typically 3 keV (see, step 204). In step 206 the specimen is imaged with the ion beam. Further, in step 302 the ion beam energy in the ion beam column is provided to be in a range of 5 keV to 50 keV, for example 20, 30 or 35 keV. That is, the ion beam is accelerated in the column and the retarding field is provided before the ion beam impinges on the specimen.

Thereby, for example, according to some embodiments, the retarding field optical system is provided before the ion beam impinges on the specimen. As one example, potentials of components other than the emitter and the specimen can be biased such that the ion beam energy in the column is raised. As another example, only the specimen voltage can be adjusted. The electrode 146 of the lens 140 may be used for providing a retarding field. Alternatively, an additional electrode may be provided or the specimen can be biased to a suitable potential, that is, the specimen acts as a retarding electrode. Typically, the ion source and the ion emitter can be controlled such that the emitter 112 has a potential difference with regard to the potential of the specimen such that the reduced energy $E_2$ on the specimen can be realized.

This allows operation of the gas field ion source ion beam device at a reduced ion beam energy on the specimen, whereby the sample damage or the load on the sample is reduced. At the same time the increased ion beam energy in the column allows for improving or almost maintaining a good resolution, which corresponds to the high energies in the ion beam column.

According to some embodiments, the ion beam is accelerated after the ion beam source 110 (see, FIG. 1) and is slowed down within or after the objective lens to the desired energy so that it is guided through the column at an increased velocity which reduces aberrations for maintaining a high resolution, and is slowed down before impingement on the sample in order to minimize sample load or damage to the sample.

According to one embodiment, the ion beam energy can be reduced within the objective lens by providing a retarding field at the last electrode 146 of the objective lens 140 (see, FIG. 1). According to another embodiment, the ion beam can be slowed down after the objective lens by providing a further electrode at a desired potential.

Generally, the acceleration and the subsequent deceleration can be achieved by either elevating the sample potential to the voltage closer to the emitter voltage and/or by leaving the sample on ground and raising the potential of the particle optical column excluding the emitter and the extractor to a high potential. Typical values for a system having an energy in the column $E_{col}$ of 30 keV and an energy $E_P$ on the specimen can be seen in table 1. Therein, $C_C$ describes the coefficient for the chromatic aberration.

| $E_{Col}/E_P$ | $E_P$/keV | $C_C/E_P$/[μm/eV] |
|---|---|---|
| 30 | 1 | 3.7 |
| 15 | 2 | 3.6 |
| 10 | 3 | 3.6 |
| 7.5 | 4 | 3.6 |

According to different embodiments, the ratio between the energy in the column and the energy on the specimen can be in a range of 6 to 30. According to yet other embodiments, the energy on the specimen can be in the range of 1 to 4 keV. According to yet other embodiments, the energy in the column can be in the range of 6 keV to 50 keV. Typical values for the energy in the column can be 12 to 30 keV.

A further improvement of this mode of operation is that in light of the increased ion beam energy in the column, the Coulomb interaction between the ions is reduced. The Coulomb interaction generally leads to an energy broadening of the ion beam and, thus, to a reduced resolution. These embodiments can be combined with each other.

According to even further embodiments, which can be combined with other embodiments described herein, the electrostatic lens 140 and/or the electrostatic lens 130 are constructed such that a distance between the neighboring electrodes is in a range of 0.5 mm to 10 mm. Further, according to yet other embodiments, the dimension along the optical axis of the ion beam column can be in a range of 200 mm to 1000 mm. Thereby, for ion beam devices with a high energy of the ion beam within the ion beam column, the electrostatic lenses are operated in a deceleration mode. This is due to the fact that a maximum value of a center electrode of the electrostatic lens exists, in particular for the above described dimensions. The central electrode is on a retarding potential, which means that the ions are slowed down between the first and the second, center electrode and are accelerated thereafter.

According to yet further embodiments described herein, the aberrations can be further reduced by providing the central electrode to a higher potential, that is, the resolution can be improved by providing an acceleration mode for the condenser and/or the objective lens as compared to the resolution that can be achieved for a deceleration lens. For the acceleration lenses the ions are first accelerated from the first electrode 132 or 142, respectively, to the second, center electrode 134 or 144, respectively.

For example, a 30 keV system would require a central electrode potential of above 200 kV which is difficult or impossible to realize. However, according to embodiments described herein, for a lower voltage column, accelerating lenses can be realized. Accordingly, by reducing the ion beam energy in the ion beam column, a reduction of resolution in light of the reduced energy can be compensated for or even over-compensated by the use of an accelerating lens.

Figure 4:
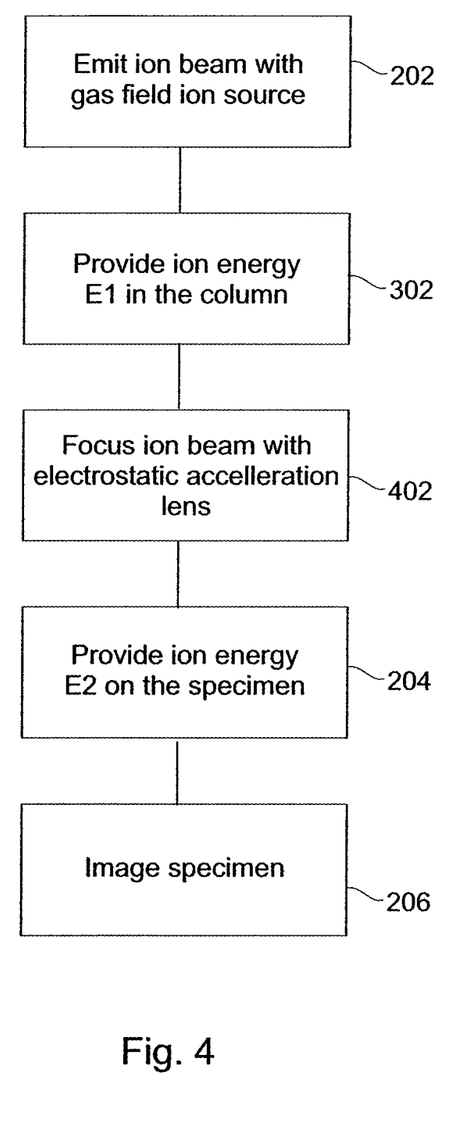
FIG. 4 illustrates embodiments of operating an ion beam device, wherein a reduced ion beam energy on the specimen is provided and an electrostatic lens is operated in acceleration mode.

FIG. 4 illustrates embodiments, wherein the ion beam is emitted by a gas field ion source in step 202. The ion beam is provided on a specimen with an energy $E_2$, which is sufficiently low to avoid undesirable specimen damage (see, step 204) and the specimen is imaged by the ion beam. According to different embodiments, the ion beam energy $E_2$ on the specimen can be in the range of 1 keV to 4 keV, for example 3 keV.

In step 302 the ion beam energy in the column is provided at the energy E1. According to different embodiments, this energy can be in the range of 4 keV to 8 keV. For focusing the ion beam with a lens, an acceleration lens is used in step 402.

According to yet other embodiments, the use of an electrostatic acceleration lens can be provided for either a first electrostatic lens, a second electrostatic lens or both electrostatic lenses. Thereby, the electrostatic lenses can typically be a condenser lens and an objective lens. According to yet other embodiments, further lenses can be included in the ion beam device, which might optionally be provided and/or operated as an acceleration lens.

According to yet other embodiments, which can be combined with other embodiments described herein, step 302 shown in FIG. 4 can be omitted. Thereby, the ion beam would travel through the column at a low energy, i.e. energy $E_2$, and at least one acceleration lens can be used for guiding and/or focusing of the ion beam.

Figure 5:
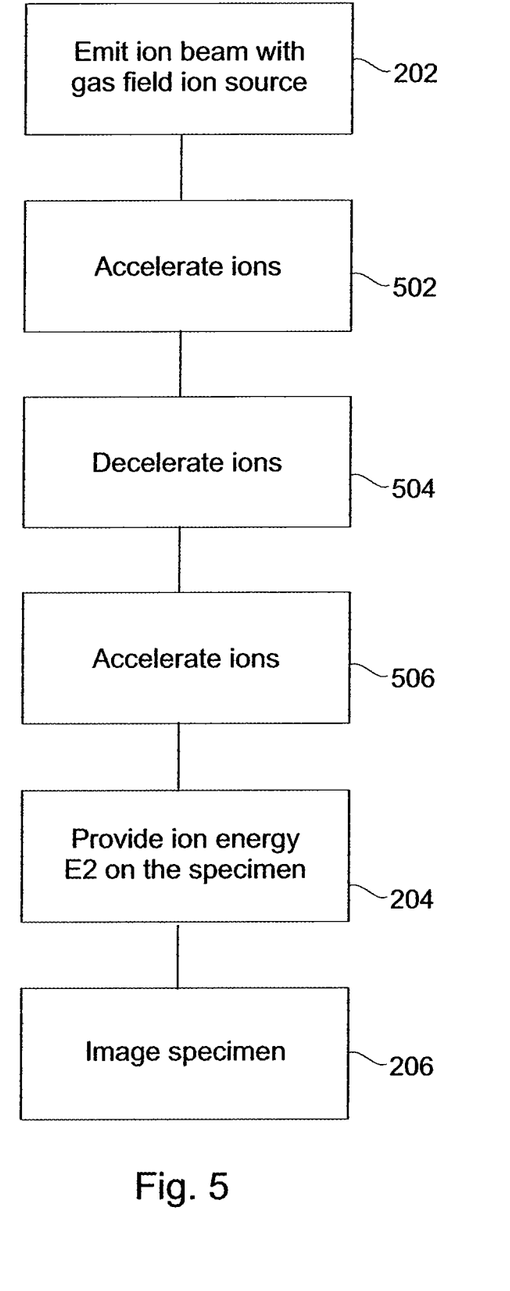
FIG. 5 illustrates embodiments of operating an ion beam device, wherein a reduced ion beam energy on the specimen is provided and an electrostatic lens is operated in acceleration mode.

FIG. 5 illustrates embodiments described herein. According thereto, an ion beam is emitted with a gas field ion source in step 202. In step 502 the ions are accelerated within an acceleration lens. Further, within step 504 the ions are decelerated to travel through the ion beam column at an intermediate energy. In step 506 the ions are again accelerated in a further acceleration lens. In step 204 the ions are provided on the specimen with an energy $E_2$ that can be chosen according to any of the embodiments described herein and which is suitable for reducing damage to the specimen or specimen load in general. In step 206 the specimen is imaged with the ion beam.

Referring back to FIG. 1, embodiments might for example be as follows. The emitter 112 can be at a potential of between 25 and 35 kV. The first electrode 132 and the third electrode 136 of the electrostatic lens 130 can be in a range of about −5 to 5 kV. The second, center electrode 134 of the electrostatic lens 130 can be at a potential of about 20 to 30 kV. Thereby, the energy of the ion beam 120 in the column can be in the range of 25 to 35 keV. The first electrode 142 and the third electrode 146 of the electrostatic (objective) lens 140 can be in a range of −5 kV to 5 kV and the second, center electrode 144 of the electrostatic lens 140 can be in a range of 15 to 25 kV. For an exemplary specimen voltage of 26 kV the final beam energy on the specimen would for a typical emitter voltage of 30 kV be 4 keV. The same final beam energy on the specimen might be realized by grounding the specimen and reducing the other potentials also by 26 kV. According to even further embodiments, other specimen voltages such as 3 kV might be realized and the corresponding mode of operation could be realized by providing the potentials at corresponding potential differences. Thereby, a reduced final beam energy on the specimen can be realized and a high intermediate energy is achieved in order to reduce sample load and/or sample damage and at the same time to improve the resolution of the imaging system.

According to even further embodiments, the emitter 112 can be at a potential of between 2 and 10 kV. The first electrode 132 and the third electrode 136 of the electrostatic lens 130 can be in a range of about −5 to 5 kV. The second, center electrode 134 of the electrostatic lens 130 can be at a potential of about −13 to −21 kV, and the third electrode 136 of the electrostatic lens 130 can be in the range of −4 kV to 4 kV. Thereby, the energy of the ion beam 120 in the column can be, for example, in the range of 2 to 10 keV. The first electrode 142 and the third electrode 146 of the electrostatic (objective) lens 140 can be in a range of −5 kV to 5 kV and the second, center electrode 144 of the electrostatic lens 140 can be in a range of −13 to −21 kV. For an exemplary specimen voltage of 3 kV, the final beam energy on the specimen would for a typical emitter voltage of 6 kV be 3 keV. The same final beam energy on the specimen might be realized by grounding the specimen and reducing the other potentials also by 3 kV. Thereby, a reduced final beam energy on the specimen, an moderate intermediate energy is achieved and an acceleration mode for the condenser lens and the objective lens can be realized in order to reduce sample load and/or sample damage and at the same time to improve the resolution of the imaging system.

These embodiments provide an acceleration mode for the condenser lens and the objective lens wherein improved chromatic aberration coefficients can be realized. Examples are shown in table 2.

| $E_{Col}/E_P$ | $E_P$/keV | $C_C/E_P$/[µm/eV] |
|---|---|---|
| 5 | 1 | 3.1 |
| 4 | 1 | 3.2 |
| 4 | 2.2 | 1.5 |
| 3 | 1 | 3.7 |
| 3 | 2.5 | 1.5 |
| 2 | 1 | 5.4 |
| 2 | 3.3 | 1.6 |

As can be seen from a comparison of table 2, the chromatic aberration coefficient can be improved as compared to the values of table 1, if the ion beam column ion beam energy is reduced and acceleration mode lenses are utilized.

According to different embodiments described herein a sample load for a very high resolution ion beam imaging device can be reduced by providing a final ion beam energy, that is a ion beam energy on the specimen, which is reduced as compared to common ion beam systems.

According to yet further embodiments, the ion beam energy in the column can be increased to a high ion beam energy, e.g., 12 to 35 keV. Thereby, the resolution of the system is improved by reduced aberrations and reduced Coulomb interaction. Thereby, the sample load can also be reduced by providing a final ion beam energy, that is a ion beam energy on the specimen, which is reduced as compared to common ion beam systems by a retarding field.

According to yet even further embodiments, which can be combined with any of the embodiments described herein, the energy in the column can be provided to be at a low ion beam energy, e.g., 1 to 4 keV, and further providing acceleration mode electrostatic lenses. In light of the reduced aberrations of the acceleration mode lenses the lower beam energy in the column can be partly compensated for, fully compensated for or even over compensated.

According to yet even further embodiments, which can be combined with any of the embodiments described above, the energy in the column can be provided to be at a moderate ion beam energy, e.g., 5 to 10 keV, and further providing acceleration mode electrostatic lenses. In light of the reduced aberrations of the acceleration mode lenses and the acceleration in the column a resolution of the device can be even further improved.

According to other embodiments, which can be combined with any of the embodiments described herein, operation conditions exist, e.g., when specific materials are inspected, when sample damage or sample load is of less relevance or when a different compromise between resolution and sample load has to be found, that the ion beam energy on the specimen can be in a range of 500 eV to 12 keV, e.g., 5 keV, 7 keV or 10 keV.

According to one embodiment, a method of operating a focused ion beam device having a gas field ion source is provided. The method being adapted for high imaging resolutions below 1 nm includes emitting a ion beam from a gas field ion source, providing a final beam energy on impingement of the ion beam on a specimen of 1 keV to 4 keV, and imaging the specimen.

According to another embodiment, a method of operating a focused ion beam device having a gas field ion source is provided. The method being adapted for high imaging resolutions below 1 nm includes emitting a ion beam from a gas field ion source, and providing a final beam energy on impingement of the ion beam on a specimen of 1 keV to 4 keV, providing an ion column ion beam to have an energy in the ion beam column which is higher than the final beam energy, decelerating the ion beam for providing the final beam energy, and imaging the specimen.

According to yet another embodiment, a method of operating a focused ion beam device having a gas field ion source is provided. The method being adapted for high imaging resolutions below 1 nm includes emitting a ion beam from a gas field ion source, and providing a final beam energy on impingement of the ion beam on a specimen of 1 keV to 4 keV, accelerating the ion beam in at least one electrostatic lens, and imaging the specimen.

According to an even further embodiment, a method of operating a focused ion beam device having a gas field ion source is provided. The method being adapted for high imaging resolutions below 1 nm includes emitting a ion beam from a gas field ion source, and providing a final beam energy on impingement of the ion beam on a specimen of 1 keV to 4 keV, providing an ion column ion beam to have an energy in the ion beam column which is higher than the final beam energy, decelerating the ion beam for providing the final beam energy, accelerating the ion beam in at least one electrostatic lens, and imaging the specimen.

While the foregoing is directed to embodiments of the invention, other and further embodiments of the invention may be devised without departing from the basic scope thereof, and the scope thereof is determined by the claims that follow.

The invention claimed is:

1. A method of operating a focused ion beam device having a gas field ion source and at least a first electrostatic lens, the first electrostatic lens including, in beam direction, a first electrode, a second electrode and a third electrode, and at least a second electrostatic lens, the second electrostatic lens including, in beam direction, a first electrode, a second electrode, and a third electrode, the method comprising:

emitting an ion beam from a gas field ion source;
  providing an ion beam energy in an ion beam column which is higher than a final beam energy, wherein the ion beam energy is 5 keV to 12 keV;
  first accelerating the ion beam to a higher energy within the first electrostatic lens between the first electrode and the second electrode by providing the second electrode to a higher potential, and thereafter first decelerating the ion beam within the first electrostatic lens between the second electrode and the third electrode;
  after the first decelerating the ion beam, second accelerating the ion beam within the second electrostatic lens between the first electrode and the second electrode by providing the second electrode to a higher potential;
  after the second accelerating the ion beam, second decelerating the ion beam within the at least second electrostatic lens for providing the final beam energy on impingement of the ion beam on a specimen of 1 keV to 4 keV; and
  imaging the specimen using the ion beam.

2. The method according to claim 1, wherein the ion beam is accelerated and subsequently decelerated before the ion beam impinges on the specimen.

3. The method according to claim 1, wherein the at least one first electrostatic lens and/or the second electrostatic lens is a lens from the group consisting of a condenser lens and a objective lens.

4. The method according to claim 1, wherein the ion beam column has a dimension along an optical axis of the device in the range of 100 mm to 1000 mm.

5. The method according to claim 1, wherein after accelerating within the at least first and second electrostatic lenses include biasing electrodes having a distance in the direction of the optical axis in the range of 0.5 mm to 10 mm.

6. The method according to claim 1, further comprising: scanning the ion beam over the specimen.

7. The method according to claim 1, wherein the method provides high imaging resolutions below 1 nm.

8. The method according to claim 1, wherein the gas field ion source is a noble gas ion source.

9. The method according to claim 1, wherein the ion beam includes helium or hydrogen ions.

* * * * *

UNITED STATES PATENT AND TRADEMARK OFFICE
CERTIFICATE OF CORRECTION

PATENT NO. : 8,735,847 B2
APPLICATION NO. : 12/277818
DATED : May 27, 2014
INVENTOR(S) : Banzhof et al.

Page 1 of 1

It is certified that error appears in the above-identified patent and that said Letters Patent is hereby corrected as shown below:

In the Claims:

Column 10, Claim 3, Line 13, delete "one".

Signed and Sealed this
Ninth Day of September, 2014

Michelle K. Lee
*Deputy Director of the United States Patent and Trademark Office*